March 26, 1968 W. L. DOELP, JR 3,374,537
METHOD OF CONNECTING LEADS TO A SEMICONDUCTIVE DEVICE
Filed March 22, 1965 3 Sheets-Sheet 1
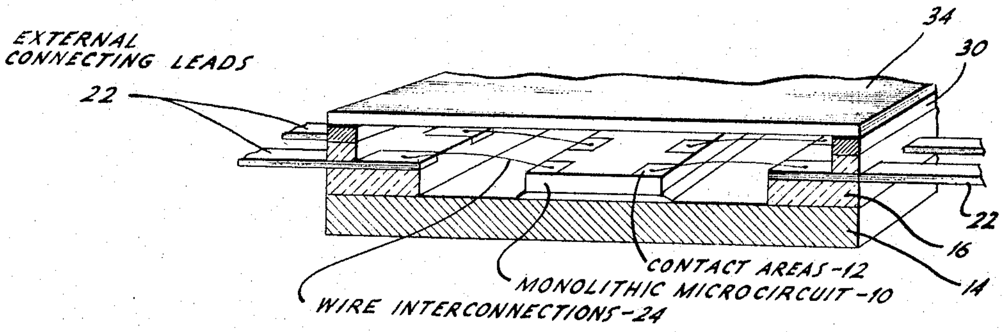
FIG. 1. PRIOR ART MONOLITHIC MICROCIRCUIT PACKAGE
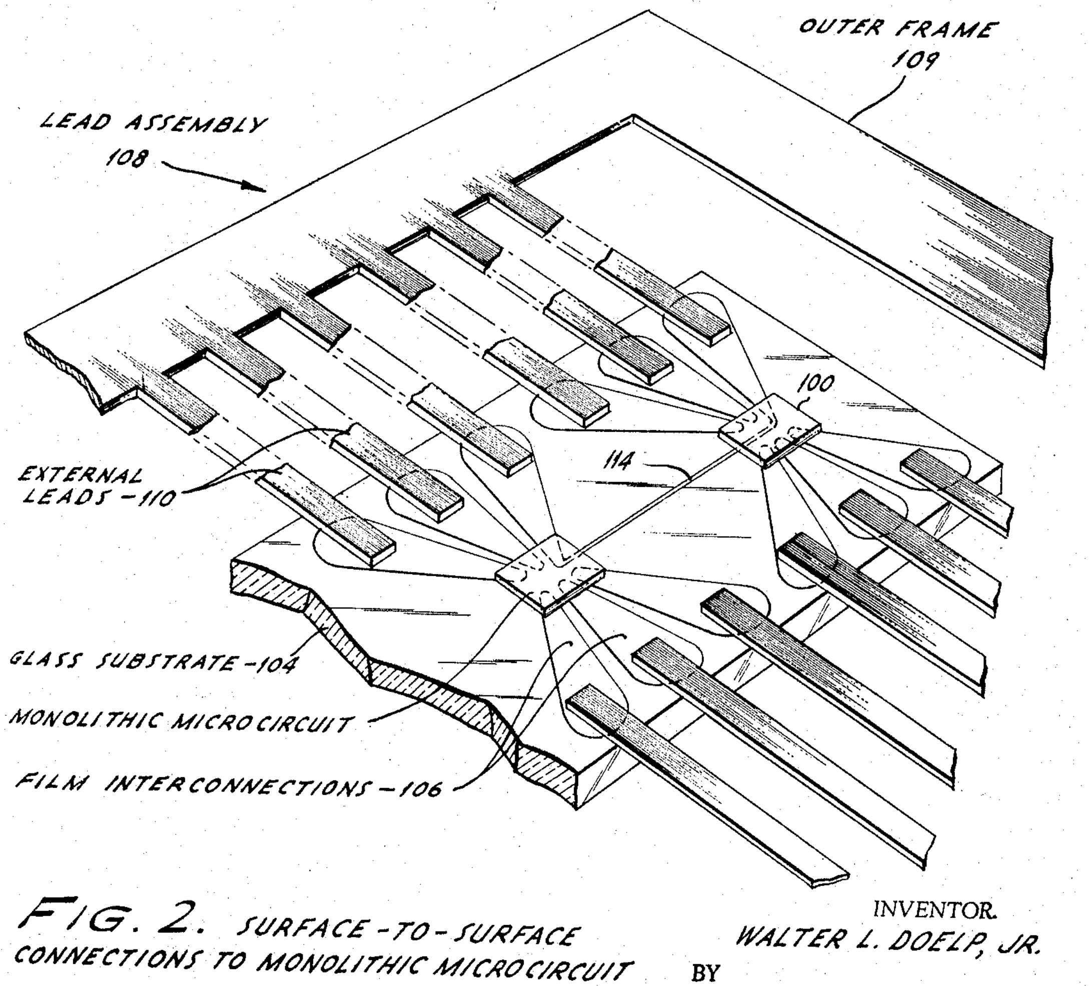
FIG. 2. SURFACE-TO-SURFACE CONNECTIONS TO MONOLITHIC MICROCIRCUIT
INVENTOR.
WALTER L. DOELP, JR.
BY
D R Bressman
ATTORNEY METHOD OF CONNECTING LEADS TO A SEMICONDUCTIVE DEVICE
Filed March 22, 1965 3 Sheets-Sheet 2
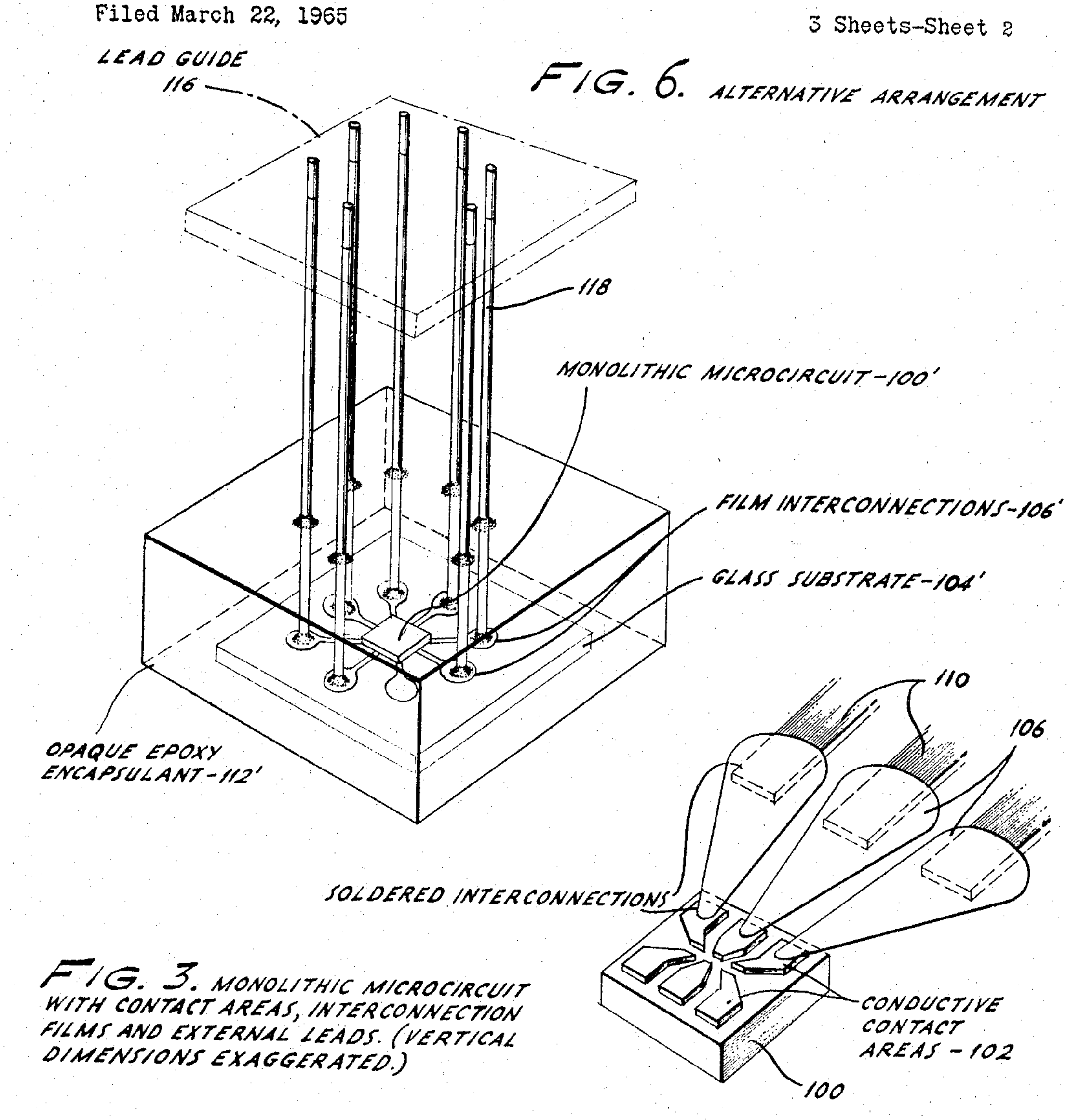
FIG. 6. ALTERNATIVE ARRANGEMENT, FIG. 3. MONOLITHIC MICROCIRCUIT WITH CONTACT AREAS, INTERCONNECTION FILMS AND EXTERNAL LEADS. (VERTICAL DIMENSIONS EXAGGERATED.)
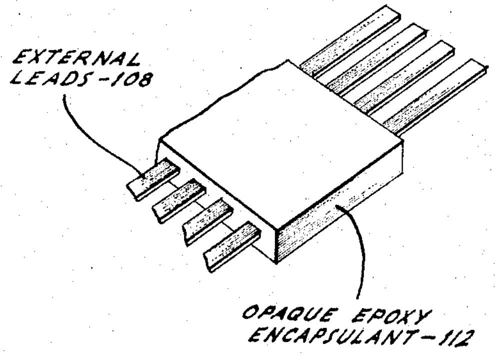
FIG. 4. ENCAPSULATED MICROCIRCUIT DEVICE OF FIGS. 2 & 3
INVENTOR.
WALTER L. DOELP, JR.
BY
D R Pressman
ATTORNEY March 26, 1968 W. L. DOELP, JR 3,374,537
METHOD OF CONNECTING LEADS TO A SEMICONDUCTIVE DEVICE
Filed March 22, 1965 3 Sheets-Sheet 3
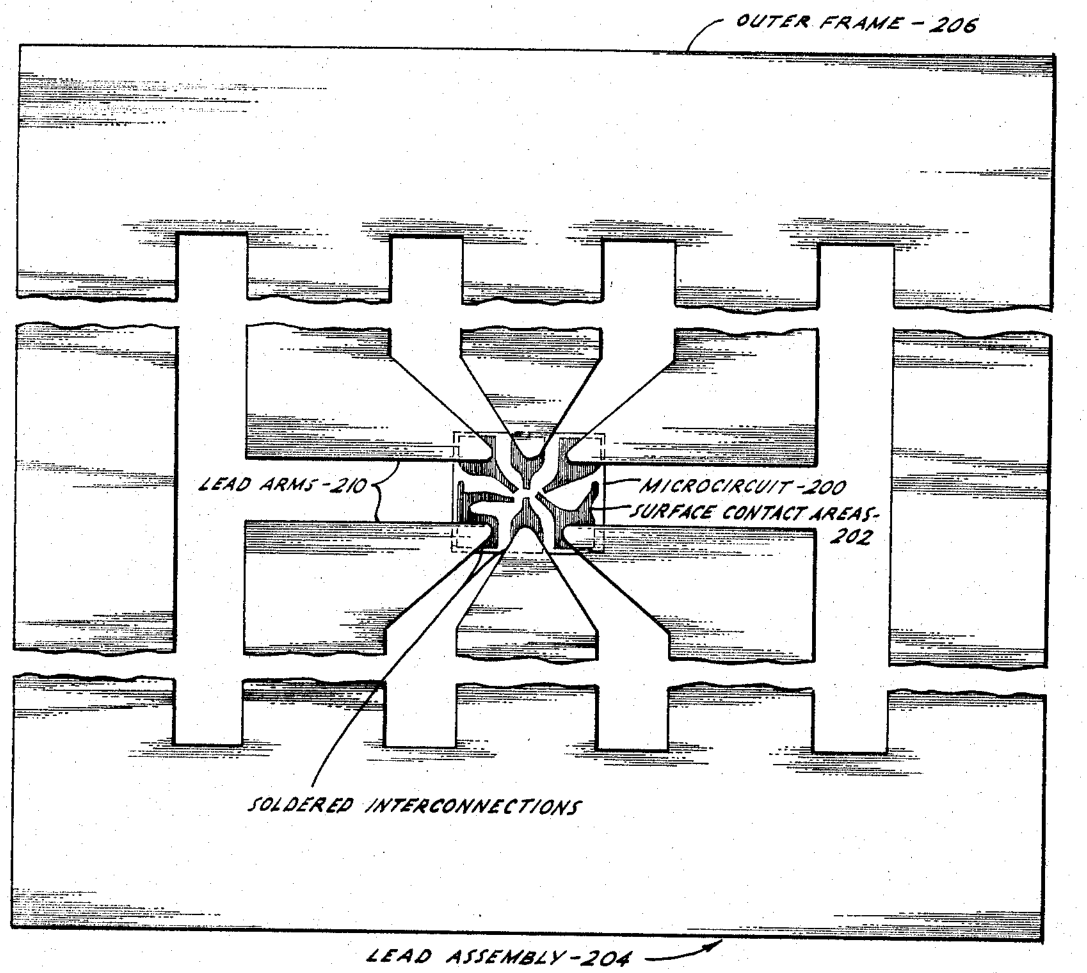
FIG. 7. DIRECT LEAD INTERCONNECTION METHOD OF CONTACTING MICROCIRCUIT CHIP
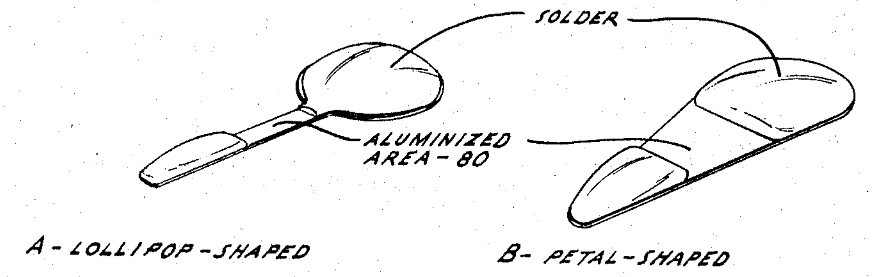
FIG. 5. LOCALLY TINNED FILM INTERCONNECTIONS
INVENTOR.
WALTER L. DOELP JR.
BY
D. R. Pressman
ATTORNEY

United States Patent Office 3,374,537

Patented Mar. 26, 1968

3,374,537

METHOD OF CONNECTING LEADS TO A SEMICONDUCTIVE DEVICE

Walter L. Doelp, Jr., Chalfont, Pa., assignor to Philco-Ford Corporation, a corporation of Delaware Filed Mar. 22, 1965, Ser. No. 441,621
1 Claim. (Cl. 29—627)

ABSTRACT OF THE DISCLOSURE

Packaged semiconductor device and assembly method utilizing semiconductor chip with surface contact areas joined to respective contact leads by respective interconnection films on substrate which supports chip and leads. Substrate, chip, and inner ends of leads are epoxy-encapsulated. All leads are attached to substrate simultaneously by means of discardable outer frame member from which leads extend inwardly.

This invention relates to the semiconductor packaging art, and more particularly to the packaging of miniaturized semiconductor dice or chips.

Sophistication of the semiconductor art has recently brought forth semiconductor devices having extremely diminutive dimensions. According to the present state of the art, for example, several transistors, capacitors, resistors, and diodes can be formed in semiconductor dice or chips having dimensions of less than 50 x 50 x 5 mils. Within such a chip may be formed, for example, a flip-flop which consists of two transistors, eight or ten resistors, several diodes, and possibly two or more capacitors. Far more complex circuitry can also be formed within such chips. These semiconductor chips, which are often referred to as monolithic microcircuits, usually have metallic interconnection films (e.g., of aluminum) formed on the top surface thereof. These films also serve as contact areas for the connection of extrenal leads to the monolith. According to one presently practiced method of providing such connections, thin wires, usually having diameters of about one mil, are bonded to the contact areas on the top surface of the monolith. The other ends of these wires are connected to relatively thick metallic leads which are supported by the container in which the microcircuit is housed.

It will be apparent that severe problems arise in conjunction with wires having one mil thicknesses. Each end of each wire must be manually attached with the aid of costly reduction manipulators and optical magnifiers. This operation, in addition to being very costly and time consuming in terms of labor, also produces a low yield of acceptable devices in a mass porduction operation. The wires are also subject to breakage and other injury. It is difficult to package the device in a moldable plastic encapsulating agent (such as epoxy) because the wires are susceptible to injury or displacement by the encapsulating agent. Consequently such semiconductive devices must be packaged in relatively expensive containers which have large volume in relation to the size of the monolith in order to protect the interconnecting wires from injury. While the perfection of the microcircuit art has greatly decreased the cost of semiconductor monoliths, the semiconductor packaging arts have not kept commensurate pace; hence the ratio of the cost of a monolithic microcircuit to the cost of its package has been steadily declining and has now assumed a minor fractional value. Therefore there is an obvious need for lower cost packaging methods.

The present invention provides several new and greatly improved methods of packaging semiconductor devices which obviate all of the aforenoted difficulties and which provide additional advantages which will be apparent from a consideration of the ensuing description thereof.

OBJECTS

Accordingly several objects of the present invention are:

(1) to provide improved methods of packaging miniaturized semiconductive device;

(2) to provide methods of packaging monolithic microcircuits which is very economical in relation to the cost of the monolith itself;

(3) to provide packaging methods which avoids the use of fragile wire leads;

(4) to provide packaging methods which result in a product which is more durable than products produced by previous packaging methods;

(5) to provide packaging methods which are easily and cheaply performed without the aid of expensive and costly equipment, which are not significantly susceptible to human errors, and which provide a packaged device of greatly reduced weight and size.

Other objects and advantages of the present invention will become apparent as the ensuing description progresses.

SUMMARY

According to one preferred embodiment of the present invention, a monolithic microcircuit having a plurality of contact areas on one surface thereof is packaged according to a surface-to-surface method as follows. A substrate, which is desirably transparent, has evaporated on the surface thereof thin-film interconnecting paths which are arranged to mate, at first ends thereof, with the respective contact areas on the surface of the semiconductor monolith. The semiconductor monolith is inverted and soldered to the film interconnecting paths on the substrate. Metallic leads are soldered to the other ends of the interconnection paths, and the entire device aforedescribed is then encapsulated in a moldable encapsulating agent.

According to another preferred embodiment of the present invention a monolithic microcircuit having a plurality of contact areas on a surface thereof is packaged by the direct lead connection method as follows. A lead assembly consisting of an outer frame having a plurality of inwardly extending lead arms whose ends are arranged to mate with the surface contacts of the microcircuit, is soldered to the surface contacts of the microcircuit. The device is encapsulated and the outer frame is trimmed away.

DRAWINGS

FIG. 1 of the drawing illustrates a typical prior art method of providing connections to and packaging of a monolithic microcircuit.

FIG. 2 shows a top view of the surface-to-surface method of the present invention of providing connections to a monolithic microcircuit.

FIG. 3 shows a bottom view of the microcircuit, the evaporated connection films, and the external leads of FIG. 2.

FIG. 4 shows the microcircuit device of the present invention after encapsulation.

FIG. 5 shows several views of locally tinned film interconnections.

FIG. 6 shows an encapsulated microcircuit device incorporating an alternative arrangement of external leads and using lollipop-shaped film interconnection paths.

FIG. 7 is a plan view of a microcircuit which is directly connected to a lead assembly.

*FIG. 1—prior art microcircuit package*

FIG. 1 illustrates a cross sectional view of a typical prior art monolithic microcircuit wafer and its package. Monolithic microcircuit 10 usually has lateral dimensions of about 50 x 50 mils and a vertical thickness of about 5 to 10 mils. On the top surface of the wafer are metallic contact areas such as 12 to which relatively thick external leads must be electrically connected.

In the prior art package of FIG. 1 wafer 10 is soldered to a metallic header 14, which may be composed of an alloy such as Kovar which is readily bondable to glass. External connection leads 22 are held in the position shown by a glass preform 16. A Kovar strip 30 is bonded to the glass preform 16 and a metallic cover 34 is brazed to strip 30. The entire package may have a rectangular shape with rounded corners.

During the assembly of the mircocircuit package of FIG. 1 the contact areas 12 on the upper surface of microcircuit 10 are connected to the inner ends of the respective external leads 22 by means of thin interconnection wires 24. As mentioned above, wires 24 usually have a diameter of about one mil, and are thus obviously extremely fragile and delicate. Each wire must be individually attached manually at each end thereof using expensive reduction manipulators and optical magnifiers.

The packaged assembly of FIG. 1 has many disadvantages. The interconnection wires 24, in addition to the aforedescribed disadvantages relating to the assembly thereof, are not able to withstand physical shocks or severe gravitational stresses without flexing. The entire package and the labor involved in assemblying same are very costly, exceeding that of the monolithic microcircuit 10. In addition, contaminants may be sealed in the package, which itself is undesirably large in relation to the size of the monolithic microcircuit 10. (Dimensions of the container have been reduced in FIG. 1 for purposes of facilitation of illustration.)

*FIGS. 2–5—surface-to-surface fabrication of monolithic microcircuit*

FIGS. 2 to 5 depict the fabrication of a monolithic microcircuit using the surface-to-surface connection method of the present invention. FIG. 2 shows a top view of a partially fabricated microcircuit package; FIG. 3 shows a bottom view of several components of FIG. 2; FIG. 4 shows a partial view of a completed microcircuit package; and FIG. 5 shows a view of locally tinned interconnection films which may be optionally used to form the microcircuit package.

A microcircuit wafer or chip such as shown at 100 in FIGS. 2 and 3 has an upper surface which includes a plurality of conductive contact areas 102 (FIG. 3) to which relatively thick external leads must be connected. Contact areas 102 may be fabricated of a two-layered chromium-nickel film (thickness exaggerated in FIG. 3) as will be discussed infra. A substrate 104, which is desirably transparent glass for reasons to be described infra, is used to provide a support for the thin film interconnections 106. Interconnections 106 are used to interconnect the conductive contact areas 102 with external leads such as 110.

The interconnections 106 are first formed on glass substrate 104 as follows. The entire surface of glass substrate 104 is first coated with a metallic film having good adherence and solderability. The two-layered chromium-nickel film discussed infra is suitable. Then, using standard photolithographic techniques, these films are selectively etched to provide the interconnections 106 which may desirably be petal-shaped as shown, or may alternatively have the shape as shown in FIGS. 5A and 6. This shape will be referred to herein as a lollipop shape.

Next both the surfaces of the interconnections 106 and surfaces of conductive contact areas 102 on monoliths 100 are tinned with a thin layer of solder.

The leads 110 are initially formed as part of a lead assembly 108 which is comprised of an outer frame member 109 having a plurality of extending leads 110. The assembly 108 is used so that the individual leads 110 will be held in fixed relationship during fabrication.

Next the glass substrate 104 is positioned on microcircuit monolith 100 so that the interconnections 106 mate with the conductive contact areas 102 on the surface of the monolith 100. Since the surfaces of interconnections 106 and contact areas 102 are both tinned, the microcircuit 100 will be sufficiently cohesive to the interconnection films so that further assembly operations can be performed without first bonding the microcircuit to the substrate. The parts have the orientation shown in FIG. 3 with the glass substrate 104 (not shown) uppermost.

According to one aspect of the invention this positioning operation can be conveniently performed visually without the aid of precise positioning jigs if substrate 104 is composed of transparent glass. According to this visual technique the monolith 100 is placed in a platform holder having a depression designed to hold monolith 100 so that the soldered surface thereof is uppermost. Next, the glass substrate 104 with the pre-formed interconnections 106 is manually positioned over this holder and is aligned visually so that the aforedescribed proper mating occurs. This operation is easily performed manually and obviates the requirement for expensive custom-made positioning jigs.

Alternatively, if substrate 104 is not transparent, the alignment can be performed with the aid of precise jigs and other aligning equipment.

After the microcircuit 100 is positioned on the glass substrate as aforedescribed, the glass substrate is inverted and the lead assembly 108 is positioned over the substrate as shown in FIG. 2 so that the ends of the leads 110 mate with the widened portions of the film interconnections 106. This operation can be performed manually if the substrate 104 is positioned in a holder and the lead assembly 108 is positioned thereover as shown in FIG. 2. A suitable clamp, which may be part of the platform holder for the lead assembly and the monolith, is then actuated to hold substrate 104 in contact with the leads 110 of the lead assembly 108. Next the entire assembly, clamped as aforementioned, is placed in a furnace or otherwise suitably heated in order to fuse the solder interfaces between the contact areas 102 and the ends of the leads 110 with the film interconnections 106. After the assembly is cooled, firm bonds between the interconnections 106, the lead assembly 110, and monoliths 100 will result.

A desirable, self-correcting feature of the invention is manifest in conjunction with this soldering operation. If the pre-soldering alignment of the leads 110, the film interconnections 106, and the monolith contact areas 102 is imprecise, the surface tension of the molten solder during heating will pull the components into correct and precise alignment. This is so because when the components are in precise alignment there is maximum contact between abutting interfaces and the molten mass of solder will have the least surface area when maximum contact exists. As is well known, surface tension exerts a force tending to reduce the surface area of a liquid. This self-correcting feature of the invention makes possible the use of a manual alignment procedure which otherwise would not provide a high yield of acceptable devices in a mass production operation due to the high incidence of human errors normally encountered in this type operation. Accordingly it is feasible to perform the mating operation manually without the use of expensive precise jigging equipment.

Next, as shown in FIG. 4, the entire assembly is encapsulated with a suitable opaque encapsulating agent 112. This encapsulating agent provides additional support for the soldered components, protects the components from ambient conditions including light, moisture, and other contaminants, and provides a dielectric housing which can serve as a mounting surface for the microcircuit assembly. The outer frame 109 is, of course, trimmed away after encapsulation.

According to the invention, each microcircuit monolith 100 may have any number of conductive contact areas 102 thereon, dependent upon the circuitry which is formed within each monolith. For instance, if only a single transistor is formed within the monolith, only three conductive contact areas 102 may be required. However if a complex circuit such as a flip-flop, an adder, or other logic circuitry is formed within the monolith, twenty or more conductive contact areas 102 may be required. Each glass substrate 104 may be designed to accommodate one or more monoliths. The pattern and number of evaporated interconnections 106 will be appropriately designed to mate with the particular contact areas on the monolith to be bonded to said substrate. As shown in FIG. 2, two such monoliths, each having six conductive contact areas, are bonded to the substrate. The interconnections 106 are arranged so that the broadened ends thereof lie at opposite edges of the substrate. However these broadened ends may be provided on all edges of the substrate if desired, or on only one or more adjacent lateral edges.

If more than one monolith is positioned on a single substrate such as shown in FIG. 2, the method of the present invention provides a desirable manner of interconnecting separate monoliths. An evaporated interconnection path 114, which is formed simultaneously with the formation of interconnections 106, is provided to interconnect a contact area and interconnection film of one monolith with a contact area and interconnection film of another monolith. It will be apparent that more intricate evaporated interconnections than is shown may be provided if desired.

*FIG. 5*

The solder interfaces on contact areas 102 and interconnections 106 will have sufficient thickness (e.g. 1 mil) to hold the monolith 100 away from the substrate 104 and the interconnection films 114 and 106 if these interconnection films are locally tinned as shown in FIG. 5. FIG. 5 shows perspective views of a lollipop-shaped interconnection film (FIG. 5A) and a petal-shaped interconnection film (FIG. 5B) wherein the ends only of each film are tinned. This local tinning operation can be performed by locally covering the center portion 80 of each film, which is not to be tinned, with a thin layer of aluminum. This layer of aluminum may be formed on center portions 80 after the interconnection films 106 and 114 are formed on glass substrate 104 by evaporating a film of aluminum over the entire substrate and selectively photolithographically etching away the aluminum film so that the areas of the interconnection films not to be tinned will be covered with aluminum. The substrate is then placed in a molten solder bath; the solder will not adhere to the surface oxide on the aluminized portions of the interconnection films.

Since the interconnection films are locally tinned as shown in FIG. 5, the solder will not flow over the entire films when the films are soldered to the microcircuits. Hence the solder will maintain its thickness as indicated in FIG. 5 and will hold the microcircuit away from the substrate.

*FIG. 6—alternative construction*

An alternative construction of the completed microcircuit is illustrated in FIG. 6. Generally this construction differs from the one described above in that the external leads are positioned normal to the substrate with the ends of the leads being butt-soldered to the interconnection films. Elements in FIG. 6 having counterparts in FIG. 2 have been designated with like but primed reference numerals.

The assembly shown in FIG. 6 is fabricated as follows.

The film interconnections 106' (shown lollipop-shaped in FIG. 5) are formed on the surface of a glass substrate 104' in a pattern arranged to mate with the contact areas on the top surface (not shown) of inverted microcircuit monolith 100'. Interconnections 106' are then tinned with solder. Monolith 100' is aligned and positioned on substrate 104' and will be self-coherent, as previously discussed. A lead guide 116 having a plurality of lead accommodating holes therein which are designed to match the widened areas of the lollipop-shaped interconnections 106' is placed in a holder over substrate 104' after it is inverted to the position shown. This holder is desirably adjustable to allow the position of guide 108' to be manipulated as desired. Wire leads 118 are dropped through the holes in guide 116 to rest on the broadened areas of interconnections 108'. The lead guide 116 is then visually adjusted so that the broadened portions of interconnections 106' mate with the ends of leads 118.

Heat is then applied to fuse all solder interfaces. When cooled, strong bonds will exist between the microcircuit, the leads, and the film interconnections. Thereafter an encapsulant 112' (desirably an opaque epoxy) is vacuum molded as indicated in phantom form.

As variation on the above construction, even stronger bonds between the ends of leads 118 and the film interconnections 106' can be effected if the ends of leads 118' are shaped to provide broader contact interfaces with film interconnections 106'. One suitable shape for the purpose is the nailhead shape.

*FIG. 7—direct lead interconnection method*

An alternative method of interconnecting leads to the microcircuit is shown in FIG. 7. According to this method the external leads are connected directly to the surface contact areas on the microcircuit. No glass substrate with interconnection films is required.

According to the method of FIG. 7 a monolithic microcircuit 200 having a plurality of solder-tinned metallic surface contact areas 202 is positioned in a suitable holder. A lead assembly 204 comprised of an outer frame 206 and a plurality of extending lead arms 210 is positioned over the microcircuit so that the ends of arms 210 mate with the respective surface contact areas 202. The arms 210 are designed so that the inner ends thereof are tapered to points, each of which mates with an exclusive one of contact areas 202. The microcircuit is clamped to the lead assembly and heat is applied to fuse the solder interfaces. After cooling, the microcircuit and the inner ends of the leads are encapsulated, desirably in an opaque plastic epoxy encapsulating agent, and the outer frame 206 is trimmed away.

The method of FIG. 7 is highly desirable since the use of the glass substrate of FIGS. 2–5 is obviated. While FIG. 7 shows a microcircuit with only six contact areas, it will be appreciated that microcircuits with twenty or more contact areas can be contacted according to this method.

*Example of specific fabrication procedure*

The following is an example of one specific procedure which may be used to fabricate the packaged microcircuit of FIGS. 2–4 according to the present invention. Microcircuit monolith 100 may be composed of monocrystalline silicon and covered with a passivating layer of silicon dioxide. Surface contacts may be provided to the different regions within monolith 100 by etching suitable holes through the passivating oxide over these regions and forming aluminum contacts over the holes. The conductive surface contact areas 102 may be connected to the aluminum contacts by, e.g., inwardly extending arms as shown in FIG. 3. These contact areas should be formed of films having good adherence and solderability. According to current practice several hundred or more devices are formed simultaneously on a single wafer of silicon about one inch in diameter. After the surface contacts and contact areas are formed, the wafer may be scribed between devices and fractured into individual monoliths along the scribe lines.

The contact areas 102 may be formed over all the devices on the wafer simultaneously by coating the entire wafer with a layer of chromium followed by a layer of nickel, both being applied in the same vacuum chamber without breaking vacuum. Thereafter the chromium and nickel are selectively etched photolithographically to form the contact areas 102. The contact areas 102 are tinned by dipping the wafer in solder.

The glass substrate 104 may be formed of any standard transparent glass including the borosilicates, Pyrex, or quartz. The size of the substrate will be dictated by the size of the microcircuit and the number of microcircuits to be positioned on the substrate. The glass should be thick enough (e.g. 5–10 mils or more) to withstand handling during processing. The evaporated interconnections may be formed by first evaporating a layer of chromium about 400–500 A. thick over the entire upper surface of the glass substrate. Chromium has good conductivity and excellent glass adherence properties. Next a layer of nickel about 500–1000 A. thick is evaporated over the layer of chromium without breaking vacuum so that the chromium layer will not be exposed to the atmosphere where oxidation can occur.

Thereafter the pattern of evaporated interconnections 106, which may also include interconnections such as 114, is formed using photolithographic etch techniques. Two separate photolithographic etches are used, one for the nickel and one for chromium. Each etch is performed by coating the entire substrate with a suitable photoresist and then exposing said resist to ultra-violet light in areas where the plating is to remain. Thereafter the photoresist is developed by washing the unexposed portions away. Suitable etchants which will attack the plated metal but not the photoresist (e.g., hot buffered hydrochloric acid for chromium and a standard nickel etch for nickel) are used to form the lollipop or petal-shaped interconnections 106. After each metal etch the resist is removed from the substrate with an etchant which will attack the developed resist not the plated metal.

Next, if it is desired to mount the monolith in spaced relation to the glass substrate to allow room for interconnections such as 114, the interconnection films 106 are locally coated with aluminum and interconnection films 114 are completely coated with aluminum. Aluminum can be selectively removed using the photolithographic techniques aforediscussed. The aluminum may be about .04 mil thick.

Next the interconnection pattern on the substrate is coated with solder by dipping the same in molten solder. Any solder may be used, such as the standard eutectic lead-tin solder aforementioned. The solder will not adhere to any aluminized areas on the interconnection films.

The lead assembly may be formed of gold plated Kovar or Dumet.

The assembly may be encapsulated as shown in FIG. 4 using standard encapsulating techniques. For example the entire assembly shown in FIG. 2 may be placed in a suitable mold which is slightly larger than glass substrate 104. This mold should have openings for the leads 108 and may be coated with a standard silicon grease mold release agent. Using any molding technique, such as vacuum molding, an epoxy encapsulating agent is introduced into the mold and allowed to cure. After the epoxy has cured sufficiently, the mold may be opened and the device is ready for testing and use.

It will be appreciated that the method of the present invention provides a highly superior encapsulating and connecting arrangement which obviates all of the aforedescribed disadvantages of the prior art techniques such as those shown in FIG. 1. The finished devices are lighter, stronger, far less costly, and far easier to fabricate than the device of FIG. 1. In addi.ion, devices are smaller, and the housing of the devices is an insulator rather than a conductive metal.

While there has been described what is at present considered to be the preferred embodiment of the invention it will be apparent that various modifications and other embodiments thereof will occur to those skilled in the art within the scope of the invention. Accordingly, it is desired that the scope of the invention be limited by the appended claim only.

1. A method of making connections to a body of semiconductive material having a planar surface with separated metallic contact areas thereon with which respective connections are desired, comprising:

(a) forming on an interconnecting substrate of electrically insulating material having a planar surface, an array of separate, elongated metallic film conductors on said planar surface, said film conductors being positioned so that a first end of each lies near the periphery of said substrate and a second end of each lies nearer the center of said substrate, the second ends of said film conductors being positioned to mate with respective ones of said contact areas on said body of semiconductive material, (b) forming on the exposed surface of said film conductors, except for the end portions thereof, a coat of a substance which is not wetted by solder, (c) forming on both end portions of said film conductors where not coated by said substrate, a coat of solder, the coat of solder on each of the second ends of said film conductors being substantially the same size as its mating contact area on said body of semiconductive material, whereby the solder coatings on said film conductors will not spread to a larger area when melted, (d) forming a lead assembly having an outer frame with a plurality of adjoining, spaced, elongated leads extending inwardly therefrom, said leads being positioned and shaped such that the inner ends thereof mate with the said first ends of said film conductors, respectively, (e) bonding said second ends of said film conductors to said contact areas, respectively, and bonding the inner ends of said leads to said first ends of said film conductors, respectively, by juxtapositioning said second ends of said film conductors with said respective contact areas on said body of semiconductive material and juxtapositioning said first ends of said film conductors with said leads and fusing said solder coatings, (f) encapsulating said device, said substrate, and the inner ends of said leads in an opaque, insulating, encapsulating agent, and (g) trimming away said outer frame to separate the outer ends of said leads from each other.

References Cited

UNITED STATES PATENTS

| | | | |
|---|---|---|---|
| 3,244,939 | 4/1966 | Sandbank. | |
| 3,256,465 | 6/1966 | Weissenstern et al. | |
| 3,270,399 | 9/1966 | Ohntrup. | |
| 3,280,019 | 10/1966 | Harding et al. | |
| 3,289,045 | 11/1966 | Pritikin et al. | |
| 3,239,719 | 3/1966 | Shower. | |
| 3,262,022 | 7/1966 | Caracciolo. | |
| 3,271,625 | 9/1966 | Caracciolo. | |
| 3,292,240 | 12/1966 | McNutt et al. | 29—155.5 |
| 3,292,241 | 12/1966 | Carroll | 29—155.5 |

DARRELL L. CLAY, *Primary Examiner.*